United States Patent
Aoki et al.

(10) Patent No.: US 9,661,780 B2
(45) Date of Patent: May 23, 2017

(54) HEAT-RECEIVER, COOLING UNIT AND ELECTRONIC DEVICE

(71) Applicant: FUJITSU LIMITED, Kawasaki-shi, Kanagawa (JP)

(72) Inventors: Michimasa Aoki, Kawasaki (JP); Masumi Suzuki, Kawasaki (JP); Jie Wei, Hachioji (JP); Fumihiro Tawa, Yokohama (JP); Kenji Sasabe, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 104 days.

(21) Appl. No.: 14/340,739

(22) Filed: Jul. 25, 2014

(65) Prior Publication Data
US 2015/0062822 A1 Mar. 5, 2015

(30) Foreign Application Priority Data

Aug. 27, 2013 (JP) .................................. 2013-175622

(51) Int. Cl.
*H05K 7/20* (2006.01)
*H01L 23/367* (2006.01)
(Continued)

(52) U.S. Cl.
CPC ........... *H05K 7/20* (2013.01); *H01L 23/3675* (2013.01); *H01L 23/467* (2013.01); *H01L 23/473* (2013.01); *H01L 2924/0002* (2013.01)

(58) Field of Classification Search
CPC .. H05K 7/20; H05K 7/20254; H05K 7/20509; H01L 23/367
(Continued)

(56) References Cited

U.S. PATENT DOCUMENTS

2004/0190251 A1* 9/2004 Prasher ............... H01L 23/4006
361/699
2005/0286234 A1* 12/2005 Campbell ............... H01L 23/42
361/719
(Continued)

FOREIGN PATENT DOCUMENTS

JP 8-222664 8/1996
JP 2003-282801 10/2003
(Continued)

OTHER PUBLICATIONS

Patent Abstracts of Japan, Publication No. 08-222664, published Aug. 30, 1996.
(Continued)

*Primary Examiner* — Courtney Smith
*Assistant Examiner* — Zhengfu Feng
(74) *Attorney, Agent, or Firm* — Staas & Halsey LLP

(57) ABSTRACT

A heat-receiver includes: a first plate that receives heat at one face from a heat generating body; a second plate that is disposed facing another face of the first plate with a spacing therebetween, and that has a greater plate thickness than a plate thickness of the first plate; a first coupling portion that couples together the first plate and the second plate; and a second coupling portion that couples together the first plate and the second plate at a position that faces across the first plate toward the heat generating body, with a gap between the second coupling portion and the first coupling portion through which a coolant is capable of passing, and that has a width along the other face of the first plate that is greater than a width of the first coupling portion, as viewed along the coolant passing direction.

23 Claims, 7 Drawing Sheets

(51) Int. Cl.
  *H01L 23/467*  (2006.01)
  *H01L 23/473*  (2006.01)
(58) Field of Classification Search
  USPC .............. 361/699, 702, 703, 719; 257/706;
    165/80.4, 104.28, 104.33
  See application file for complete search history.

(56) References Cited

U.S. PATENT DOCUMENTS

2012/0126390 A1\* 5/2012 Mori .................. H01L 23/3735
    257/706
2014/0307388 A1\* 10/2014 Chiu .................... H01L 23/473
    361/702

FOREIGN PATENT DOCUMENTS

| JP | 2006-13296 | 1/2006 |
| JP | 2009-260058 | 11/2009 |
| JP | 2010-182831 | 8/2010 |

OTHER PUBLICATIONS

Patent Abstracts of Japan, Publication No. 2003-282801, published Oct. 3, 2003.
Patent Abstracts of Japan, Publication No. 2006-013296, published Jan. 12, 2006.
Patent Abstracts of Japan, Publication No. 2010-182831, published Aug. 19, 2010.
Japanese Office Action dated Mar. 7, 2017 in corresponding Japanese Patent Application No. 2013-175622.
Espacenet Bibliographic Data, Publication No. 2009-260058, published Nov. 5, 2009.

\* cited by examiner

HEAT-RECEIVER, COOLING UNIT AND ELECTRONIC DEVICE

CROSS-REFERENCE TO RELATED APPLICATION

This application is based upon and claims the benefit of priority of the prior Japanese Patent Application No. 2013-175622, filed on Aug. 27, 2013, the entire contents of which are incorporated herein by reference.

FIELD

The embodiments discussed herein are related to a heat-receiver, a cooling unit, and an electronic device.

BACKGROUND

Cooling devices, such as heat sinks, are known that cool heat generating bodies such as semiconductor elements.

RELATED PATENT DOCUMENTS

Japanese Patent Application Laid-Open (JP-A) No. 2006-13296
JP-A No. H08-222664
JP-A No. 2010-182831
JP-A No. 2003-282801

SUMMARY

According to an aspect of the embodiments, a heat-receiver includes: a first plate portion that receives heat at one face from a heat generating body; a second plate portion that is disposed facing another face of the first plate portion with a spacing therebetween, and that has a greater plate thickness than a plate thickness of the first plate portion; a first coupling portion that couples together the first plate portion and the second plate portion; and a second coupling portion that couples together the first plate portion and the second plate portion at a position that faces across the first plate portion toward the heat generating body, with a gap between the second coupling portion and the first coupling portion through which a coolant is capable of passing, and that has a width along the other face of the first plate portion that is greater than a width of the first coupling portion, as viewed along the coolant passing direction.

The object and advantages of the invention will be realized and attained by the elements and combinations particularly pointed out in the claims.

It is to be understood that both the foregoing general description and the following detailed description are exemplary and explanatory and are not restrictive of the invention.

DESCRIPTION OF EMBODIMENTS

Explanation follows regarding exemplary embodiments of technology disclosed herein.

Electronic Device 10

Figure 1:
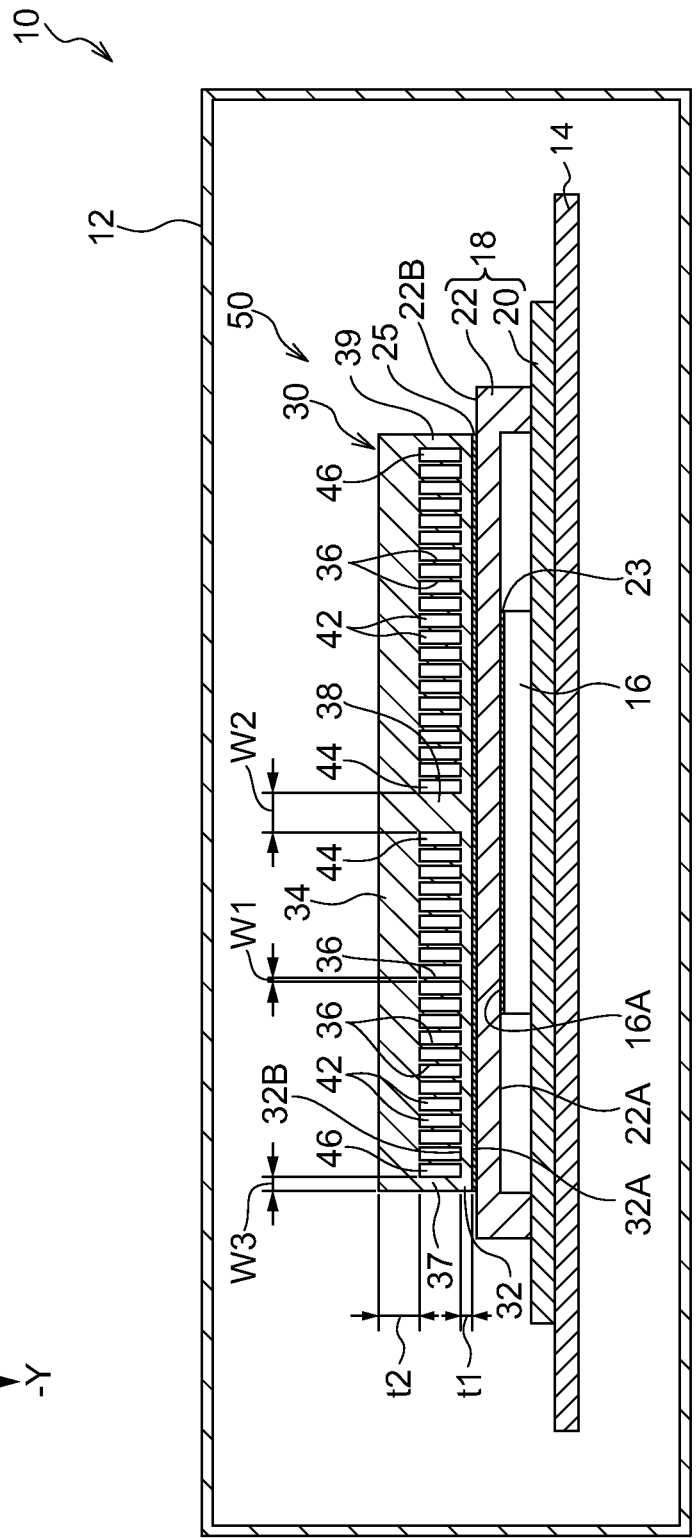
FIG. 1 is a side cross-section view illustrating an electronic device according to an exemplary embodiment.
Figure 2:
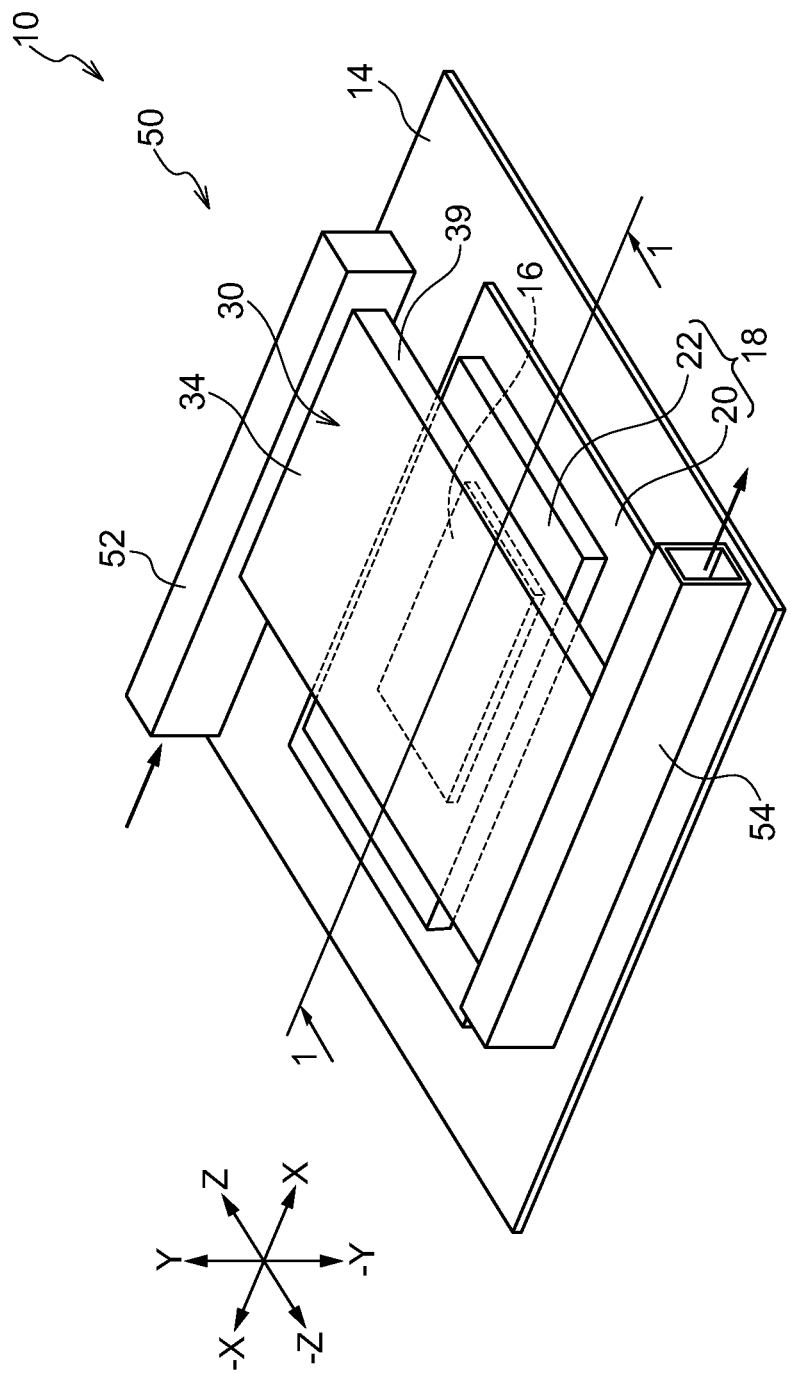
FIG. 2 is a perspective view illustrating an electronic device according to the exemplary embodiment.

Explanation follows regarding the electronic device 10. FIG. 1 is a side cross-section view illustrating the electronic device 10. Specifically, FIG. 1 is a cross-section view taken along line 1-1 in FIG. 2. FIG. 2 is a perspective view illustrating the electronic device 10. Note that the X direction, −X direction, Y direction (upward), −Y direction (downward), Z direction and −Z direction employed in the below explanation refer to the arrow directions indicated in the drawings. A cross inside a circle in the drawings represents an arrow pointing from the front toward the back of the sheet of paper, and a dot inside a circle in the drawings represents an arrow pointing from the back toward the front of the sheet of paper.

As illustrated in FIG. 1, the electronic device 10 according to the present exemplary embodiment includes a housing 12. A printed circuit board 14 is provided inside the housing 12. As illustrated in FIG. 1 and FIG. 2, an electronic component 16 (an example of a heat generating body) housed in a package 18 is provided on the printed circuit board 14. Note that the housing 12 is not illustrated in FIG. 2.

The package 18 is a member that envelops the electronic component 16. Specifically, the package 18 includes a package substrate 20 and a spreader 22 that disperses the heat of the electronic component 16. The spreader 22 is a rectangular shaped box that is open toward the package substrate 20 side (the −Y direction side). The spreader 22 is configured using a material that has excellent thermal conductivity. Specifically, the spreader 22 is configured, for example, using a metal such as aluminum or copper.

The electronic component 16 is a component that is a target for cooling, and is mounted on the package substrate 20. An example of the electronic component 16 is an integrated circuit. As an example, the electronic component 16 is configured with a rectangular shape (plate shape).

As illustrated in FIG. 1, an upper face 16A of the electronic component 16, and an inner face 22A of the spreader 22 are joined by a joining member 23. The joining member 23 is configured using a metal material, such as an alloy (a filler metal), a grease, an elastomer, or the like.

The electronic device 10 further includes a cooling unit 50 that cools the electronic component 16. The cooling unit 50 includes a heat-receiving jacket 30 (an example of a heat-receiver) provided on the spreader 22.

The heat-receiving jacket 30 includes a heat-receiving plate portion 32 (an example of a first plate portion), and a top plate portion 34 (an example of a second plate portion). The heat-receiving jacket 30 further includes heat-dissipating portions 36 (an example of first coupling portions), a heat-transfer member 38 (an example of a second coupling portion), and side wall portions 37, 39.

The heat-receiving plate portion 32, the top plate portion 34, the heat-dissipating portions 36, the heat-transfer member 38, and the side wall portions 37, 39 are integrally formed together in the heat-receiving jacket 30. The heat-receiving jacket 30 is configured using a material that has excellent thermal conductivity. Specifically, the heat-receiving jacket 30 is, for example, configured using a metal such as aluminum or copper. The heat-receiving jacket 30 is formed, for example, by extrusion molding.

The heat-receiving plate portion 32 is configured in a plate shape having a thickness oriented in the Y direction. Furthermore, the heat-receiving plate portion 32 is formed in a quadrilateral shape (specifically, a rectangular shape), when viewed along the −Y direction (plan view). A lower face 32A (an example of one face) of the heat-receiving plate portion 32 faces the electronic component 16 side. Specifically, the lower face 32A of the heat-receiving plate portion 32 is joined to an upper face 22B of the spreader 22 by a joining member 25. The heat-receiving plate portion 32 thereby receives heat from the electronic component 16, through the spreader 22, with the lower face 32A. The heat from the electronic component 16 is then transferred from the lower face 32A to an upper face 32B in the heat-receiving plate portion 32. Note that the joining member 25 is configured using a metal material such as an alloy (a filler metal), grease, elastomer, or the like.

The top plate portion 34 is configured as a plate shape having a thickness in the Y direction. Furthermore, the top plate portion 34 is formed in a quadrilateral shape (specifically, a rectangular shape), when viewed along the −Y direction (plan view), the same size as the heat-receiving plate portion 32. A plate thickness t2 of the top plate portion 34 is configured thicker than a plate thickness t1 of the heat-receiving plate portion 32. The top plate portion 34 is disposed facing the upper face 32B (an example of another face) of the heat-receiving plate portion 32 with a spacing therebetween. Specifically, the top plate portion 34 and the heat-receiving plate portion 32 are disposed running parallel to each other along the X direction.

The side wall portion 37 is configured as a plate shape having a thickness in the X direction. Furthermore, the side wall portion 37 is configured as a rectangular shape, when viewed along the X direction, having a length in the Z direction. The side wall portion 37 couples together an −X direction end portion of the top plate portion 34 and an −X direction end portion of the heat-receiving plate portion 32. Heat is thereby transferred from the heat-receiving plate portion 32 to the side wall portion 37. The side wall portion 37 principally transfers heat that has been transferred from the heat-receiving plate portion 32 to coolant that flows through flow paths 46, described later.

The side wall portion 39 is configured as a plate shape having a thickness in the X direction. Furthermore, the side wall portion 39 is configured with a rectangular shape, when viewed along the X direction, the same size as the side wall portion 37. The side wall portion 39 couples together an X direction end portion of the top plate portion 34 and an X direction end portion of the heat-receiving plate portion 32. Heat is thereby transferred from the heat-receiving plate portion 32 to the side wall portion 39. The side wall portion 39 principally transfers the heat that has been transferred from the heat-receiving plate portion 32 to coolant that flows through flow paths 46, described later.

Plural heat-dissipating portions 36 are disposed between the side wall portion 37 and the heat-transfer member 38, at intervals along the X direction between the heat-transfer member 38 and the side wall portion 39. Each of the heat-dissipating portions 36 couples together the heat-receiving plate portion 32 and the top plate portion 34. Heat is thereby transferred from the heat-receiving plate portion 32 to each of the heat-dissipating portions 36. Note that, specifically, the plural heat-dissipating portions 36 are disposed so as to run parallel to each other along the Y direction.

Each of the heat-dissipating portions 36 is configured as a plate shape having a thickness in the X direction. Furthermore, each of the heat-dissipating portions 36 is configured with a rectangular shape, when viewed along the X direction, the same size as the side wall portion 37. Namely, each of the heat-dissipating portions 36 is formed as a single plate linking a −Z direction end of the heat-receiving jacket 30 to a Z direction end thereof. Note that each of the heat-dissipating portions 36 may also be configured so as to be divided into plural portions along the Z direction. Furthermore, a width W1 along the X direction of each of the heat-dissipating portions 36 is configured narrower than a width W3 along the X direction of the side wall portions 37, 39.

The heat-transfer member 38 couples together the heat-receiving plate portion 32 and the top plate portion 34 at a position that faces the electronic component 16 from across the heat-receiving plate portion 32. A width W2 along the X direction of the heat-transfer member 38 is configured as wider than the width W1 along the X direction of the heat-dissipating portions 36 and the width W3 along the X direction of the side wall portions 37, 39. Namely, the heat-transfer member 38 is configured as a portion with a larger thermal capacity than that of the heat-dissipating portions 36 and the side wall portions 37, 39.

Note that, in the present exemplary embodiment, no coupling portion is provided between the heat-receiving plate portion 32 and the top plate portion 34 to couple the heat-dissipating portions 36 and the heat-transfer member 38 together in the X direction. Furthermore, no coupling portion is provided between the heat-receiving plate portion 32 and the top plate portion 34 to couple the respective heat-dissipating portions 36 together in the X direction, and no coupling portion is provided to couple the heat-dissipating portions 36 and the side wall portions 37, 39 together in the X direction.

Flow paths 42 (examples of a gap), through which the coolant is capable of flowing, are formed between respective pairs of the heat-dissipating portions 36. Moreover, flow paths 44 (examples of a gap), through which the coolant is capable of flowing, are formed between each of the heat-dissipating portions 36 that are adjacent to the heat-transfer member 38, and the heat-transfer member 38. Namely, the flow paths 44 are provided to the −X direction side and the X direction side of the heat-transfer member 38. Furthermore, flow paths 46 (a spacing), through which coolant is capable of flowing, are formed between each of the heat-dissipating portions 36 adjacent to the side wall portions 37, 39 and the side wall portions 37, 39. As an example, the widths along the X direction of the flow paths 42, 44, 46 are configured the same as each other.

Coolant flows through the flow paths 42, 44, 46 in the −Z direction. An upstream side end portion (a Z direction end portion) of the respective flow paths 42, 44, 46 communicates with a supply pipe 52, described later. A downstream side end portion (a −Z direction end portion) of the respective flow paths 42, 44, 46 communicates with a discharge pipe 54, described later. Note that a fluid such as water, or a gas such as air, is used as the coolant.

Since, as previously described, the width W1 along the X direction is narrower and the thermal capacity is lower for each of the heat-dissipating portions 36 than for the heat-transfer member 38, the amount of heat from the heat-receiving plate portion 32 that each of the heat-dissipating portions 36 retains is low. Namely, the amount of heat transferred by each of the heat-dissipating portions 36 to the coolant flowing through the flow paths 42, 44, 46 is greater than the amount of heat transferred from the heat-dissipating portions 36 to the top plate portion 34. The heat-dissipating portions 36 therefore principally dissipate heat to the coolant flowing through the flow paths 42, 44, 46.

Moreover, as previously described, since the width W2 along the X direction is wider and the thermal capacity is larger for the heat-transfer member 38 than for the heat-dissipating portions 36, heat from the heat-receiving plate portion 32 is carried by the heat-transfer member 38 and transferred to the top plate portion 34. Namely, the amount of heat transferred from the heat-transfer member 38 to the top plate portion 34 is greater than the amount of heat transferred by the heat-transfer member 38 to coolant flowing through the flow paths 42, 44, 46. The heat-transfer member 38 thereby principally transfers heat to the top plate portion 34. Furthermore, the top plate portion 34 transfers the heat that has been transferred from the heat-transfer member 38 to coolant flowing through the flow paths 42, 44, 46 from the Y direction side of the coolant.

Figure 3:
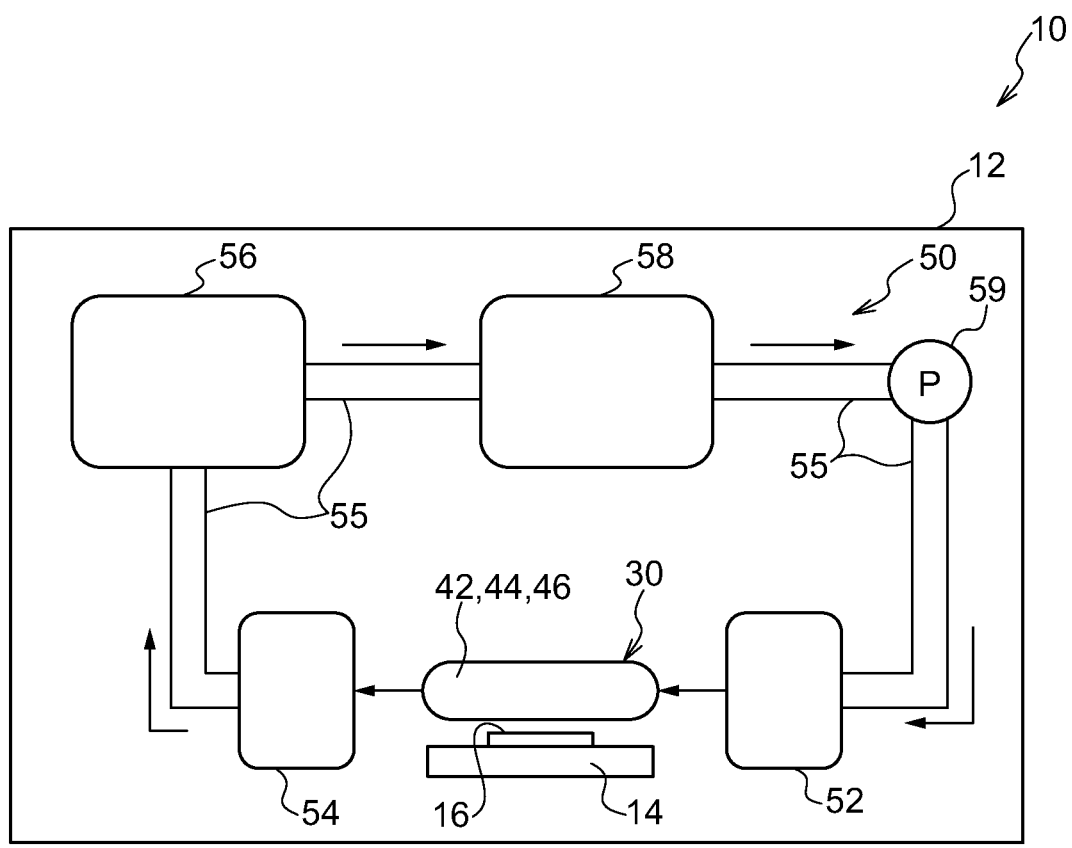
FIG. 3 is a block diagram illustrating an electronic device according to the exemplary embodiment.

As illustrated in FIG. 2 and FIG. 3, the cooling unit 50 includes the supply pipe 52 that supplies coolant to the flow paths 42, 44, 46, the discharge pipe 54 that discharges coolant from the flow paths 42, 44, 46, and through-flow pipes 55 that cause the coolant to flow from the discharge pipe 54 to the supply pipe 52. A circulation path is thereby formed to circulate the coolant in the cooling unit 50, by the flow paths 42, 44, 46, the discharge pipe 54, the through-flow pipes 55 and the supply pipe 52.

A heat exchanger 56, serving as a cooling portion, a tank 58, serving as a storage portion, and a pump 59 (an example of a supply portion), serving as a drive portion, are provided to the through-flow pipes 55. Driving the pump 59 circulates the coolant around the circulation path configured by the flow paths 42, 44, 46, the discharge pipe 54, the through-flow pipes 55, and the supply pipe 52. Coolant is thereby supplied to the flow paths 42, 44, 46.

The heat exchanger 56 cools coolant that has risen in temperature. Note that the cooling portion is not limited to the heat exchanger 56, as long as it is capable of cooling the coolant. The tank 58 temporarily stores the coolant cooled by the heat exchanger 56. Note that the tank 58 may include a function to remove gaseous components from the temporarily stored coolant.

Operation of the Exemplary Embodiment

Explanation follows regarding operation of the present exemplary embodiment.

Figure 4:
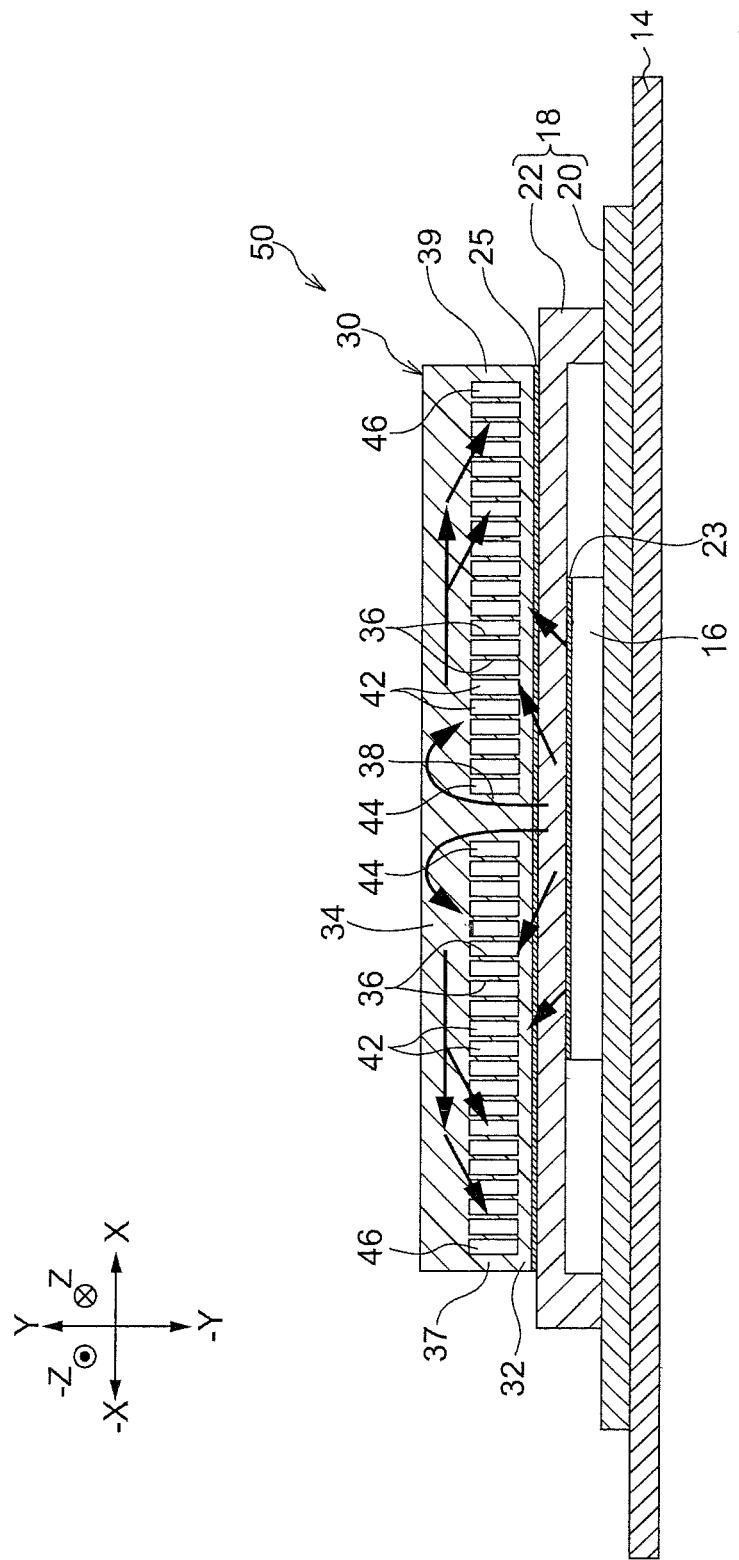
FIG. 4 is a side cross-section view illustrating paths of heat from a heat generating body to a coolant in the electronic device of FIG. 1.

As illustrated in FIG. 4, in the present exemplary embodiment, heat generated by the electronic component 16 is transferred from the electronic component 16 through the spreader 22 to the heat-receiving plate portion 32. A portion of the heat transferred to the heat-receiving plate portion 32 is directly transferred from the heat-receiving plate portion 32 to the coolant flowing inside the flow paths 42, 44, 46.

Another portion of the heat transferred to the heat-receiving plate portion 32 is transferred from the heat-receiving plate portion 32 to the coolant through the heat-dissipating portions 36, the side wall portions 37, 39 and the heat-transfer member 38. Note that the amount of heat transferred from each of the heat-dissipating portions 36 to the top plate portion 34 is less than the amount of heat transferred from each of the heat-dissipating portions 36 to the coolant.

Of the heat transferred from the heat-receiving plate portion 32 to the heat-transfer member 38, any heat that is not transferred to the coolant is transferred to the top plate portion 34. The heat transferred to the top plate portion 34 is then transferred to the coolant, either directly from the top plate portion 34, or through the heat-dissipating portions 36.

In this manner, heat from the electronic component 16 is not only transferred in the present exemplary embodiment to the coolant by routes from the heat-receiving plate portion 32 to the coolant, either directly or through the heat-dissipating portions 36, but is also transferred to the coolant by routes via the heat-transfer member 38 and the top plate portion 34. Namely, in the present exemplary embodiment, heat is transferred to the coolant not only from the −Y direction side (the lower side), but also from the Y direction side (the upper side).

Figure 5:
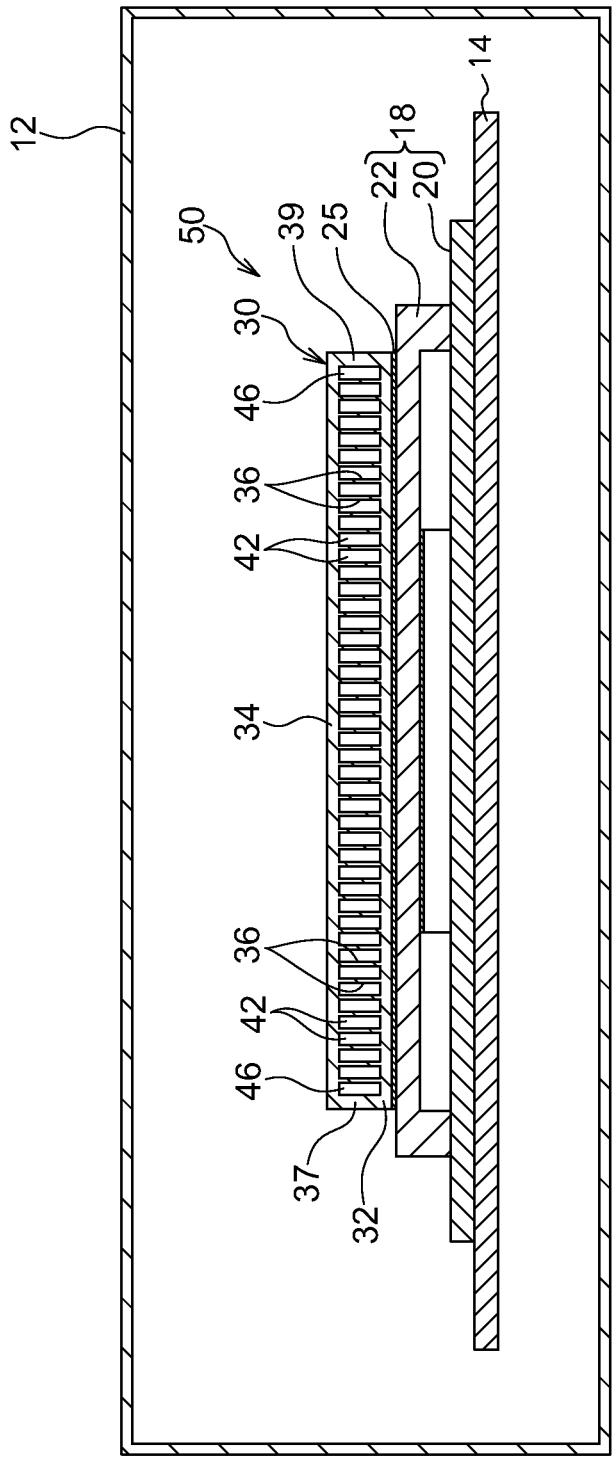
FIG. 5 is a side cross-section view illustrating an electronic device according to a Comparative Example.

In a Comparative Example, as illustrated in FIG. 5, in which the plate thickness of a top plate portion 34 is configured the same as the plate thickness of a heat-receiving plate portion 32, and a heat-transfer member 38 is not included, heat from an electronic component 16 is transferred to the coolant as described below. Namely, heat from the electronic component 16 is principally transferred to the coolant either directly from the heat-receiving plate portion 32 or through the heat-dissipating portions 36, and almost no heat is transferred to the coolant via the top plate portion 34. Namely, in the Comparative Example, heat is transferred to the coolant from the −Y direction side (the lower side).

In contrast thereto, in the present exemplary embodiment as previously described, heat is not only transferred to the coolant from the −Y direction side (the lower side), but also from the Y direction side (the upper side), thereby improving the efficiency of cooling by the coolant compared to the Comparative Example. The cooling performance for cooling the heat from the electronic component 16 is thereby improved.

Moreover, in the present exemplary embodiment, the flow paths 44 are disposed at the X direction side and the −X direction side of the heat-transfer member 38 respectively. Namely the flow paths 44 are disposed at both sides of the heat-transfer member 38 so as to sandwich the heat-transfer member 38 along the X direction. As a result, the effect of transferring heat to the coolant at the heat-transfer member 38, which reaches a higher temperature than the heat-dissipating portions 36, is greater than in a case in which a flow path 44 is only disposed at one side of the heat-transfer member 38. The cooling performance for cooling the heat from the electronic component 16 is thereby improved.

Furthermore, in the present exemplary embodiment, no coupling portion is provided between the heat-receiving plate portion 32 and the top plate portion 34 to couple the heat-dissipating portions 36 and the heat-transfer member 38 together in the X direction. Moreover, no coupling portions are provided between the heat-receiving plate portion 32 and the top plate portion 34 to couple together the respective heat-dissipating portions 36 in the X direction, and no coupling portions are provided to couple the respective heat-dissipating portions 36 and the side wall portions 37, 39 together in the X direction. As a result, the flow path resistance of the coolant flowing through the flow paths 42, 44, 46 is not increased.

Modified Examples

Explanation follows regarding Modified Examples of the present exemplary embodiment.

Figure 6:
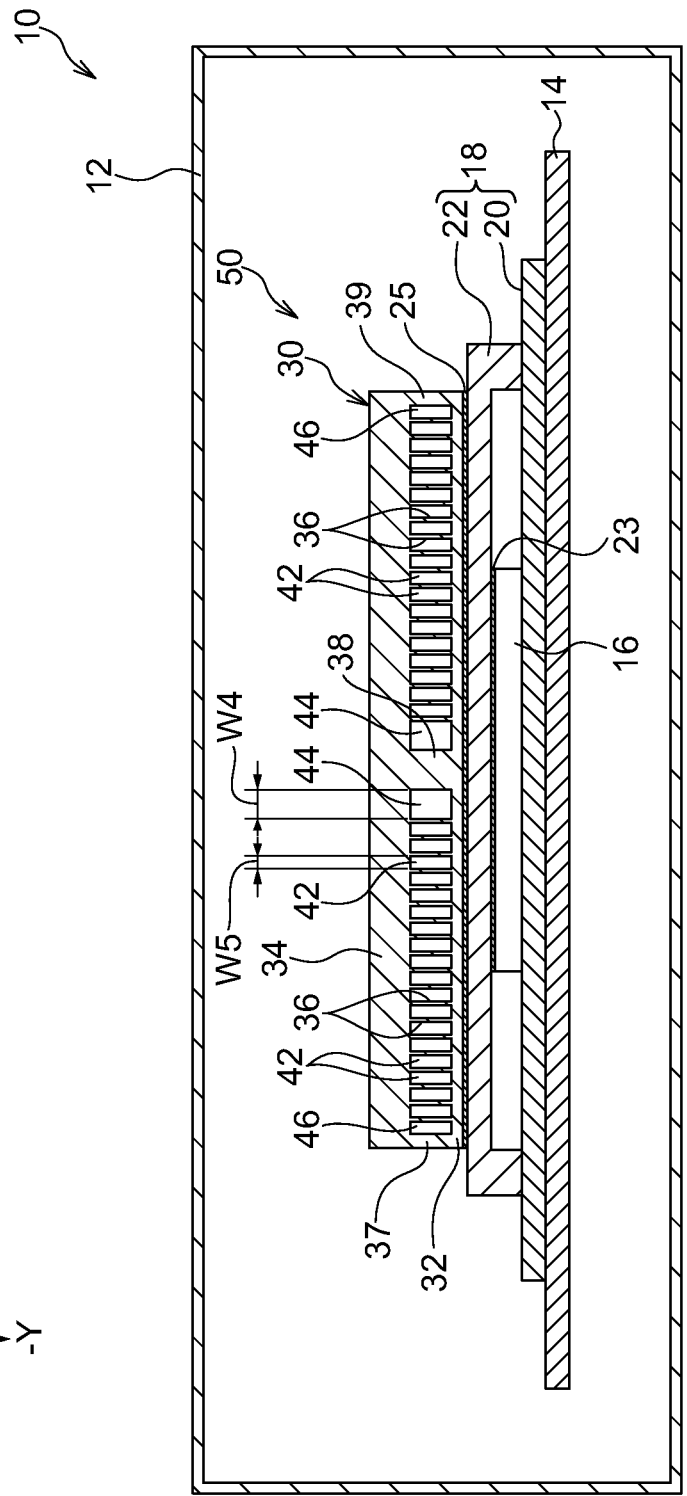
FIG. 6 is a side cross-section view illustrating an electronic device according to a Modified Example.

In the exemplary embodiment previously described, the X direction widths of the flow paths 42, 44, 46 are configured the same as each other, however configuration is not limited thereto. For example, as illustrated in FIG. 6, an X direction width W4 of the flow paths 44 may be configured as wider than an X direction width W5 of the flow paths 42. In a Modified Example, the amount of coolant flowing at the heat-transfer member 38, that reaches a higher temperature than the heat-dissipating portions 36, is thereby increased, thus improving the cooling performance.

Figure 7:
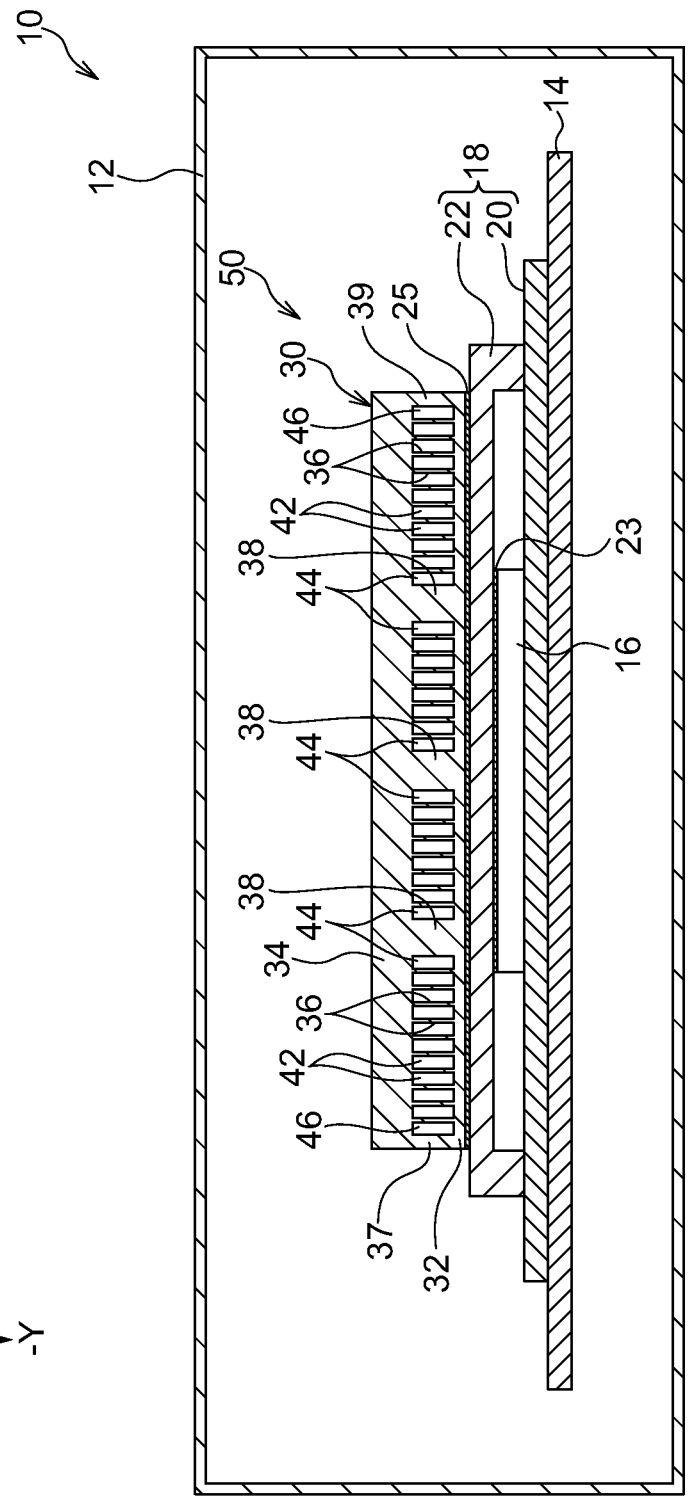
FIG. 7 is a side cross-section view illustrating an electronic device according to a Modified Example.

Moreover, in the exemplary embodiment previously described, a single heat-transfer member 38 is provided, however as illustrated in FIG. 7, plural heat-transfer members 38 may be provided. In such a Modified Example, heat from the electronic component 16 can be transferred effectively to the top plate portion 34, and heat is the transferred effectively to the coolant, not only from the −Y direction side but also from the Y direction side. Note that the plural heat-transfer members 38 may also be disposed adjacent to each other in the X direction.

Moreover, in the exemplary embodiment previously described, the top plate portion 34 is disposed at the upper side (the Y direction side) of the heat-receiving plate portion 32, however configuration is not limited thereto. For example, the top plate portion 34 may be disposed to a lateral side (the X direction, for example), or the −Y direction side (the lower side) of the heat-receiving plate portion 32. Namely, the relationship between the disposed positions of each portion of the electronic device 10 and the direction of gravitational force is not important.

Moreover, although the coolant is circulated in the exemplary embodiment previously described, a structure may also be employed in which coolant is not circulated.

Moreover, in the exemplary embodiment previously described, the heat-receiving plate portion 32 receives heat from the electronic component 16 through the spreader 22, however configuration is not limited thereto. The heat-receiving plate portion 32 may receive heat directly from the electronic component 16 by disposing the heat-receiving plate portion 32 in contact with the electronic component 16.

A suitable combination may be implemented from the plural Modified Examples described above.

Exemplary embodiments of the technology disclosed herein have been explained above, however there is no limitation to the above configuration, and obviously various improvements and modifications may be implemented within a range not departing from the spirit of technology disclosed herein.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A heat-receiver, comprising:
   a first plate portion that receives heat at a first face from a heat generating body;
   a second plate portion facing a second face of the first plate portion, and having a greater plate thickness than a plate thickness of the first plate portion;
   at least one first coupling portion that couples together the first plate portion and the second plate portion;
   a second coupling portion that thermally couples together the first plate portion and the second plate portion,
   wherein said second coupling portion is positioned to correspond to a central portion of the heat generating body, with the first plate portion being between the second coupling portion and the heat generating body; and
   a gap between the second coupling portion and the at least one first coupling portion through which a coolant passes in a direction,
   wherein the second coupling portion has a width along the second face of the first plate portion that is greater than a width of each of the at least one first coupling portions, as viewed along the coolant passing direction, and
   wherein a thermal capacity of the second coupling portion is greater than a thermal capacity of each of the at least one first coupling portions.

2. The heat-receiver of claim 1, wherein:
   the at least one first coupling portion is a plurality of the first coupling portions disposed along the second face of the first plate portion as viewed along the coolant passing direction, and the gap is a plurality of gaps between the plurality of first coupling portions, respectively, through which the coolant passes; and
   a width of the gap between the second coupling portion and an adjacent one of the plurality of first coupling portions is greater than a width of each of the plurality of gaps between a remainder of the plurality of the first coupling portions.

3. The heat-receiver of claim 2, further comprising:
   at least one third coupling portion disposed between groups of the plurality of first coupling portions such that some of the plurality of gaps are positioned between each of the at least one third coupling portion and the respective groups of the plurality of first coupling portions,
   wherein the at least one third coupling portion has a width equal to the second coupling portion.

4. The heat-receiver of claim 1, wherein:
   between the first plate portion and the second plate portion there is no coupling portion to couple the at least one first coupling portion and the second coupling portion together.

5. The heat-receiver of claim 1, wherein:
   the second coupling portion is a plurality of the second coupling portions between the first and second plate portions.

6. The heat-receiver of claim 1, wherein:
   the second coupling portion transfers heat that the first plate portion has received from the heat generating body to the second plate portion; and
   the second plate portion transfers the heat that has been transferred from the second coupling portion to the coolant passing through the gap.

7. A cooling unit, comprising:
   a first plate portion that receives heat at a first face from a heat generating body;
   a second plate portion facing a second face of the first plate portion, and having a greater plate thickness than a plate thickness of the first plate portion;
   at least one first coupling portion that couples together the first plate portion and the second plate portion;
   a second coupling portion that thermally couples together the first plate portion and the second plate portion,
   wherein said second coupling portion is positioned to correspond to a central portion of the heat generating body, with the first plate portion being between the second coupling portion and the heat generating body; and a gap between the second coupling portion and the at least one first coupling portion through which a coolant passes in a direction, wherein the second coupling portion has a width along the second face of the first plate portion that is greater than a width of each of the at least one first coupling portions, as viewed along the coolant passing direction, and wherein a thermal capacity of the second coupling portion is greater than a thermal capacity of each of the at least one first coupling portions; and a supply portion that supplies the coolant to the gap.

8. The cooling unit of claim 7, wherein:

The at least one first coupling portion is a plurality of the first coupling portions disposed along the second face of the first plate portion as viewed along the coolant passing direction, and the gap is a plurality of gaps between the plurality of first coupling portions, respectively, through which the coolant passes; and a width of the gap between the second coupling portion and an adjacent one of the plurality of first coupling portions is greater than a width of each of the plurality of gaps between a remainder of the plurality of the first coupling portions.

9. The cooling unit of claim 8, further comprising:

at least one third coupling portion disposed between groups of the plurality of first coupling portions such that some of the plurality of gaps are positioned between each of the at least one third coupling portion and the respective groups of the plurality of first coupling portions, wherein the at least one third coupling portion has a width equal to the second coupling portion.

10. The cooling unit of claim 7, wherein:

between the first plate portion and the second plate portion there is no coupling portion to couple the at least one first coupling portion and the second coupling portion together.

11. The cooling unit of claim 7, wherein:

the second coupling portion is a plurality of the second coupling portions between the first and second plate portions.

12. The cooling unit of claim 7, wherein:

the second coupling portion transfers heat that the first plate portion has received from the heat generating body to the second plate portion; and the second plate portion transfers the heat that has been transferred from the second coupling portion to the coolant passing through the gap.

13. An electronic device, comprising:

an electronic component;

a first plate portion that receives heat at a first face from the electronic component;

a second plate portion facing a second face of the first plate portion, and having a greater plate thickness than a plate thickness of the first plate portion;

at least one first coupling portion that couples together the first plate portion and the second plate portion;

a second coupling portion that thermally couples together the first plate portion and the second plate portion, wherein said second coupling portion is positioned to correspond to a central portion of the heat generating body, with the first plate portion being between the second coupling portion and the heat generating body; and a gap between the second coupling portion and the at least one first coupling portion through which a coolant passes in a direction, wherein the second coupling portion has a width along the second face of the first plate portion that is greater than a width of each of the at least one first coupling portions, as viewed along the coolant passing direction, and wherein a thermal capacity of the second coupling portion is greater than a thermal capacity of each of the at least one first coupling portions; and a supply portion that supplies the coolant to the gap.

14. The electronic device of claim 13, wherein:

the at least one first coupling portion is a plurality of the first coupling portions disposed along the second face of the first plate portion as viewed along the coolant passing direction, and the gap is a plurality of gaps between the plurality of first coupling portions, respectively, through which the coolant passes; and a width of the gap between the second coupling portion and an adjacent one of the plurality of first coupling portions is greater than a width of each of the plurality of gaps between a remainder of the plurality of the first coupling portions.

15. The electronic device of claim 14, further comprising:

at least one third coupling portion disposed between groups of the plurality of first coupling portions such that some of the plurality of gaps are positioned between each of the at least one third coupling portion and the respective groups of the plurality of first coupling portions, wherein the at least one third coupling portion has a width equal to the second coupling portion.

16. The electronic device of claim 13, wherein:

between the first plate portion and the second plate portion there is no coupling portion to couple the at least one first coupling portion and the second coupling portion together.

17. The electronic device of claim 13, wherein:

the second coupling portion is a plurality of the second coupling portions between the first and second plate portions.

18. The electronic device of claim 13, wherein:

the second coupling portion transfers heat that the first plate portion has received from the electronic component to the second plate portion; and the second plate portion transfers the heat that has been transferred from the second coupling portion to the coolant passing through the gap.

19. The heat-receiver of claim 1, further comprising:

side wall portions that couple together the first plate portion and the second plate portion, wherein the width of the second coupling portion is wider than a width of the side wall portions.

20. The cooling unit of claim 7, further comprising:

side wall portions that couple together the first plate portion and the second plate portion, wherein the width of the second coupling portion is wider than a width of the side wall portions.

21. The heat receiver of claim 1, wherein the first plate portion, the second plate portion, the at least one first coupling portion and the second coupling portion are integrally formed together.

22. The cooling unit of claim 7, wherein the first plate portion, the second plate portion, the at least one first coupling portion and the second coupling portion are integrally formed together.

23. The electronic device of claim 13, wherein the first plate portion, the second plate portion, the at least one first coupling portion and the second coupling portion are integrally formed together.

* * * * *